(12) United States Patent
Kim et al.

(10) Patent No.: US 9,177,891 B2
(45) Date of Patent: Nov. 3, 2015

(54) SEMICONDUCTOR DEVICE INCLUDING CONTACT PADS

(71) Applicant: SAMSUNG ELECTRONICS CO., LTD., Suwon-Si, Gyeonggi-Do (KR)

(72) Inventors: Keun-Nam Kim, Suwon-Si (KR);
Sun-Young Park, Hwaseong-Si (KR);
Soo-Ho Shin, Hwaseong-Si (KR);
Kye-Hee Yeom, Suwon-Si (KR);
Hyeon-Woo Jang, Suwon-Si (KR);
Jin-Won Jeong, Seoul (KR);
Chang-Hyun Cho, Yongin-Si (KR);
Hyeong-Sun Hong, Seongnam-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 16 days.

(21) Appl. No.: 14/045,648

(22) Filed: Oct. 3, 2013

(65) Prior Publication Data

US 2014/0110851 A1    Apr. 24, 2014

(30) Foreign Application Priority Data

Oct. 23, 2012  (KR) .................. 10-2012-0117910

(51) Int. Cl.
*H01L 23/52* (2006.01)
*H01L 23/48* (2006.01)
*H01L 27/108* (2006.01)

(52) U.S. Cl.
CPC .......... *H01L 23/48* (2013.01); *H01L 27/10885* (2013.01); *H01L 27/10814* (2013.01); *H01L 27/10855* (2013.01); *H01L 27/10888* (2013.01); *H01L 2924/0002* (2013.01)

(58) Field of Classification Search
CPC ................... H01L 27/10814; H01L 27/10855; H01L 27/10888; H01L 27/10885
USPC ........................................................... 257/773
See application file for complete search history.

(56) References Cited

U.S. PATENT DOCUMENTS

| 7,696,567 | B2 | 4/2010 | Haller et al. | |
| 7,755,201 | B2* | 7/2010 | Kim | 257/774 |
| 2003/0213982 | A1* | 11/2003 | Kim | 257/204 |
| 2006/0226472 | A1* | 10/2006 | Baek | 257/316 |
| 2007/0096155 | A1* | 5/2007 | Baek et al. | 257/208 |
| 2008/0067678 | A1* | 3/2008 | Kim | 257/750 |
| 2008/0160740 | A1 | 7/2008 | Ahn et al. | |
| 2009/0085083 | A1* | 4/2009 | Shin | 257/297 |
| 2010/0084710 | A1* | 4/2010 | Kim et al. | 257/347 |
| 2010/0085800 | A1 | 4/2010 | Yeom | |
| 2010/0144107 | A1 | 6/2010 | Haller et al. | |

(Continued)

FOREIGN PATENT DOCUMENTS

JP  2012-19035  1/2012
KR  10-2008-0063038  7/2008

(Continued)

*Primary Examiner* — Nicholas Tobergte
(74) *Attorney, Agent, or Firm* — F. Chau & Associates, LLC

(57) ABSTRACT

A semiconductor device includes a plurality of bit lines that intersect an active region on a substrate and extend in a first direction, a contact pad formed on the active region between adjacent bit lines, and a plurality of spacers disposed on sidewalls of the plurality of bit lines. An upper portion of the contact pad is interposed between adjacent spacers, and a lower portion of the contact pad has a width greater than a distance between adjacent spacers.

14 Claims, 21 Drawing Sheets

(56) References Cited

U.S. PATENT DOCUMENTS

2011/0147889 A1   6/2011   Tsuchiya
2011/0220977 A1   9/2011   Yoon et al.
2012/0091532 A1*  4/2012   Han et al. ...................... 257/368

FOREIGN PATENT DOCUMENTS

| KR | 10-2012-0003741 | 1/2012 |
| KR | 10-2012-0003742 | 1/2012 |
| KR | 10-2012-0012222 | 2/2012 |

* cited by examiner

B - B'

C - C'

SEMICONDUCTOR DEVICE INCLUDING CONTACT PADS

CROSS-REFERENCE TO RELATED APPLICATIONS

This application claims priority under 35 U.S.C. 119 from Korean Patent Application No. 10-2012-0117910, filed on Oct. 23, 2012 in the Korean Intellectual Property Office, and all the benefits accruing therefrom, the contents of which are herein incorporated by reference in their entirety.

BACKGROUND

Embodiments of the inventive concept are directed to a semiconductor device, and more particularly, to a semiconductor device that includes a contact plug.

With an increase in the integration density of semiconductor devices and the shrinkage of the semiconductor devices, contact plugs have been downscaled. Thus, resistance of a contact plug wiring has increased, which can degrade electrical properties of the semiconductor devices and complicate a process of forming the contact plug.

SUMMARY

According to an aspect of the inventive concept, there is provided a semiconductor device including a plurality of bit lines that intersect an active region on a substrate and extend in a first direction, a contact pad disposed on the active region and between adjacent bit lines, and a plurality of spacers formed on sidewalls of the plurality of bit lines. An upper portion of the contact pad may be interposed between adjacent spacers, and a lower portion of the contact pad may have a width greater than a distance between adjacent spacers.

The contact pad may further include an epitaxial semiconductor layer, and may be self-aligned with a sidewall of at least one of the plurality of spacers.

The contact pad may have a first portion in contact with the sidewall of the at least one of the plurality of spacers.

The contact pad may have a second portion disposed under the at least one of the plurality of spacers, and the second portion of the contact pad may overlap the at least one of the plurality of spacers in a vertical direction.

The semiconductor device may further include a contact plug disposed on the contact pad between adjacent bit lines A bottom surface of the at least one of the plurality of spacers may be disposed below a bottom surface of the plurality of bit lines.

The semiconductor device may further include a buried insulating layer disposed between the substrate and the plurality of bit lines, and a bit line contact interposed in the buried insulating layer and configured to electrically connect the active region with at least one of the plurality of bit lines. The contact pad may have a rounded sidewall that protrudes in a second direction perpendicular to the first direction, and is in contact with the buried insulating layer.

According to another aspect of the inventive concept, there is provided a semiconductor device including: a buried insulating layer disposed on a substrate, a plurality of bit lines disposed on the buried insulating layer that extend in a first direction, the plurality of bit lines having sidewalls upon which first spacers are disposed, a plurality of contact pads interposed in the buried insulating layer between adjacent bit lines, each of the plurality of contact pads having a width greater than a distance between adjacent first spacers, and a plurality of contact plugs respectively disposed on the plurality of contact pads between adjacent bit lines.

The buried insulating layer may include a first recess that extends in the first direction. The plurality of contact pads may be in contact with an inner wall of the first recess.

The semiconductor device may further include an isolation layer disposed on the substrate that defines an active region on the substrate. The isolation layer may include a second recess disposed in a portion thereof not covered by the buried insulating layer. Each of the plurality of contact pads may be in contact with an inner wall of the second recess.

An upper portion of a sidewall of at least one of the plurality of contact pads may be in contact with a sidewall and bottom surface of a corresponding first spacer.

The semiconductor device may further include a plurality of second spacers, each second spacer being disposed between at least one of the plurality of bit lines and a corresponding first spacer. Bottom surfaces of the first spacers may be below bottom surfaces of the second spacers.

The semiconductor device may further include a plurality of second spacers, each second spacer being disposed between at least one of the plurality of bit lines and a corresponding first spacer. Bottom surfaces of the first spacers may be above bottom surfaces of the second spacers. Each of the plurality of contact pads may be spaced apart from the first spacers.

Each of the plurality of contact pads may include an epitaxial semiconductor layer.

Each of the plurality of contact pads may include a doped polycrystalline semiconductor layer.

According to another aspect of the inventive concept, there is provided a method of fabricating a semiconductor device, including forming a plurality of bit line contacts in a buried insulating layer on a substrate, the bit line contacts being electrically connected to active regions of the substrate, forming a plurality of bit lines on the buried insulating layer, where a top surface of the buried insulating layer is exposed at a level below a bottom surface of the bit lines, forming a first spacer layer on the buried insulating layer to cover the plurality of bit lines, anisotropically etching the first spacer layer to form a plurality of first spacers on sidewalls of the plurality of bit lines and exposed sidewall portions of the bit line contacts, wherein a top surface of the buried insulating layer not covered by the plurality bit lines is below a bottom surface of the first spacers; forming a second spacer layer on the buried insulating layer to cover the plurality of first spacers and the plurality of bit lines; anisotropically etching the second spacer layer to expose portions of the buried insulating layer not covered by the plurality of bit lines to form a plurality of second spacers on the plurality of first spacers, wherein an exposed top surface of the buried insulating layer between adjacent bit lines is below a bottom surface of the second spacers; forming contact holes by removing portions of the buried insulating layer exposed between the bit lines; and forming contact pads on active region portions exposed by the contact holes.

Anisotropically etching the first spacer layer may further include etching the first spacer layer until the portions of the buried insulating layer not covered by the bit lines are exposed, and over-etching the first spacer layer until up to a predetermined thickness of the exposed buried insulating layer is removed.

Anisotropically etching the second spacer layer may further include etching the second spacer layer to expose portions of the buried insulating layer not covered by the bit lines to form the second spacers on the first spacers, and over-etching and removing up to a predetermined thickness of the exposed buried insulating layer.

A step of forming a contact hole may further include removing portions of the buried insulating layer exposed between the bit lines to form contact holes, and removing sidewall portions of the buried insulating layer exposed by the contact holes to form enlarged contact holes and to expose the top surfaces of the active regions covered with the buried insulating layer, wherein the contact pads are formed on the active region portions exposed by the enlarged contact holes.

The contact pads may be formed by a selective epitaxial growth (SEG) process using the exposed portions of the active regions as a seed layer.

DETAILED DESCRIPTION OF EXEMPLARY EMBODIMENTS

Figure 1A:
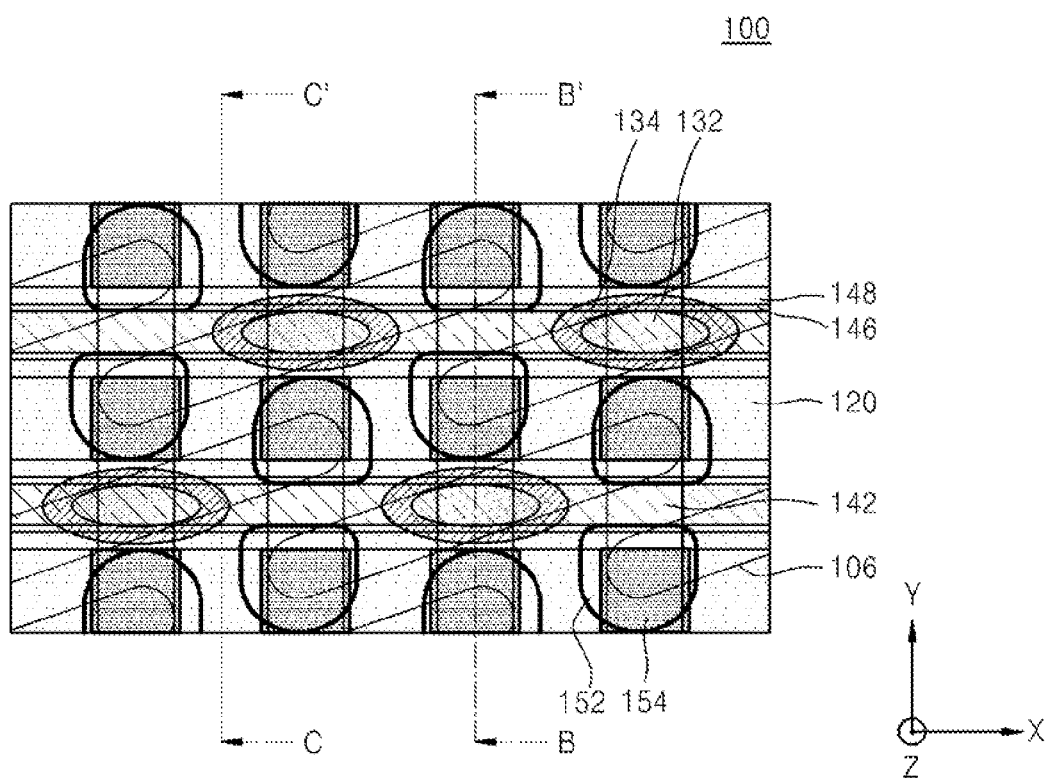
FIG. 1A is a plan view of a semiconductor device according to exemplary embodiments of the inventive concept.

Embodiments of the inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. In the drawings, the thicknesses of layers and regions are exaggerated for clarity, and similar reference numbers may refer to similar elements.

Figure 1B:
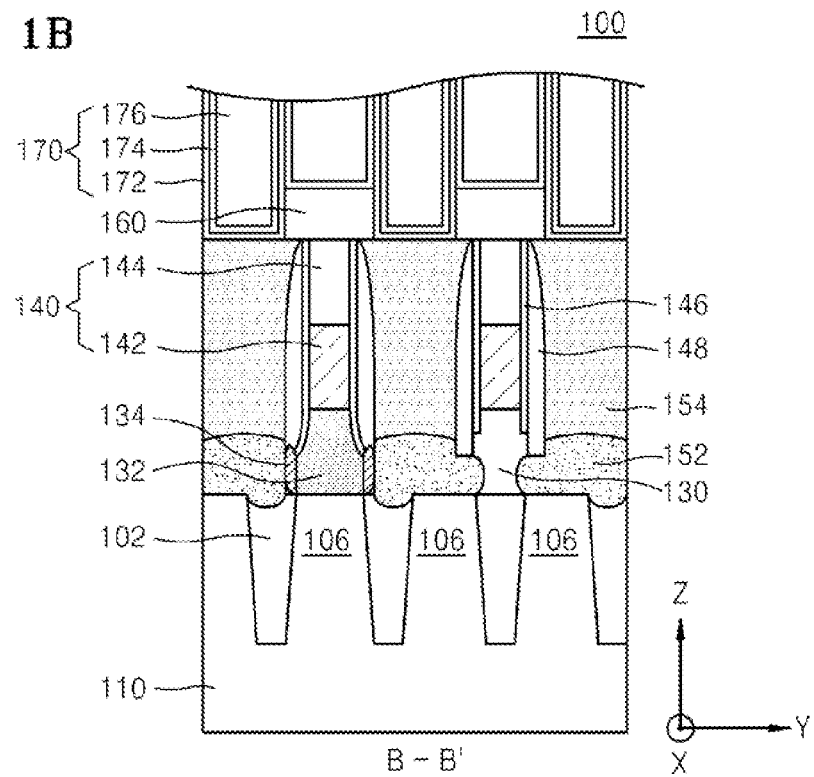
FIGS. 1B and 1C are respective cross-sectional views taken along lines B-B' and C-C' of FIG. 1A.
Figure 1C:
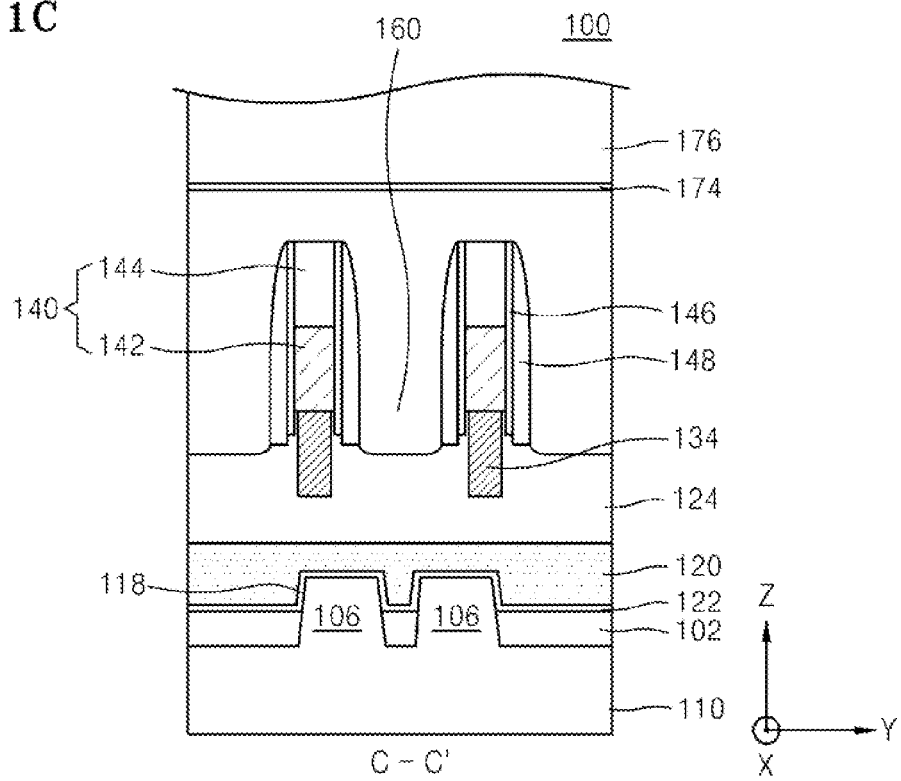

FIG. 1A is a plan view of a semiconductor device 100 according to exemplary embodiments of the inventive concept, and FIGS. 1B and 1C are respective cross-sectional views taken along lines B-B' and C-C' of FIG. 1A.

Referring to FIGS. 1A through 1C, the semiconductor device 100 may include a substrate 110 in which a plurality of active regions 106 are defined by isolation regions 102. In an embodiment, the substrate 110 may include a semiconductor substrate formed of, for example, silicon (Si), germanium (Ge), silicon germanium (SiGe), silicon carbide (SiC), gallium arsenide (GaAs), indium arsenide (InAs), or indium phosphide (InP). In addition, a doped well (not shown) may be further formed in the substrate 110.

A plurality of word lines 120 may be buried in the substrate 110. The plurality of word lines 120 may extend parallel to one another at a level below a top surface of the substrate 110. Bottom surfaces of the plurality of word lines 120 may be stepped, and saddle fin field effect transistors (saddle FIN-FETs) may be formed in the plurality of active regions 106. In some embodiments, the plurality of word lines 120 may be formed of at least one material selected from titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

A gate dielectric layer 122 may be interposed between the plurality of active regions 106 and the plurality word lines 120. The gate dielectric layer 122 may be formed of at least one material selected from a silicon oxide layer, a silicon nitride layer, a silicon oxynitride layer, an oxide/nitride/oxide (ONO) layer, and a high-k dielectric layer having a higher dielectric constant than the silicon oxide layer.

Each of the plurality of word lines 120 may be covered with a capping layer 124. The capping layer 124 may include a silicon oxide layer, a silicon nitride layer, a silicon oxynitride layer, or a combination thereof.

A plurality of bit line stack structures 140 may be formed on the substrate 110 and extend in a first horizontal direction (the x-axis direction of FIG. 1A). Each of the plurality of bit line stack structures 140 may include a bit line 142 and a hard mask 144 that covers a top surface of the bit line 142. In an embodiment, each of bit lines 142 may include a conductive material, such as doped polysilicon (poly-Si), a metal, a metal nitride, or a metal silicide. For example, each of the bit lines 142 may have a stack structure formed by sequentially stacking doped poly-Si, tungsten nitride, and tungsten.

Each of the bit lines 142 may be connected to the corresponding active region 106 via a bit line contact 132 formed through a buried insulating layer 130. Bit line spacers 134 may surround the bit line contact 132, and portions of sidewalls of the bit line contact spacers 134 may be in contact with the buried insulating layer 130. In an embodiment, the bit line contact spacers 134 may include silicon nitride.

First spacers 146 and second spacers 148 may be sequentially formed on sidewalls of each of the bit line stack structures 140.

The first spacers 146 may be uniformly formed to a predetermined thickness along the sidewalls of the corresponding bit line stack structure 140, and extend to the bit line contact 132 disposed under the bit line stack structure 140. That is, lowermost portions of the first spacers 146 may extend below the bottom surfaces of the bit lines 142.

The second spacers 148 may cover the first spacers 146 and extend to the bit line contact spacers 134 disposed under the bit line stack structures 140. Accordingly, lowermost portions of the second spacers 148 may extend below the bottom surfaces of the bit lines 142.

A plurality of contact pads 152 may be arranged in a row along the first, x-axis, direction between adjacent bit line stack structures 140. The contact pads 152 may self-align with sidewalls of the second spacers 148 formed on the sidewalls of adjacent bit line stack structures 140. That is, upper portions of the contact pads 152 may be in contact with the sidewalls of the second spacers 148 and disposed between adjacent second spacers 148. Lower portions of the contact pads 152 may be disposed under the second spacers 148 and overlap the second spacers 148 in a vertical direction (the z-axis direction of FIGS. 1B and 1C). In addition, the lower portions of the contact pads 152 may have rounded sidewalls that protrude in a second direction (the y-axis direction of FIG. 1B) perpendicular to the first direction, and that contact the buried insulating layer 130. Accordingly, the lower portions of the contact pads 152 may have a width greater than a distance between adjacent second spacers 148. In some exemplary embodiments, the contact pads 152 may include an epitaxially grown semiconductor layer. For example, the contact pads 152 may include an epitaxially grown silicon layer.

A plurality of contact plugs 154 may be respectively formed on the plurality of contact pads 152 between adjacent bit line stack structures 140. The contact plugs 154 may self-align with the sidewalls of the second spacers 148 disposed adjacent to the contact plugs 154. That is, sidewalls of the contact plugs 154 may be in contact with the sidewalls of the second spacers 148.

Capacitors 170 may be respectively formed on the contact plugs 154. Each capacitor 170 may include a lower electrode 172, a dielectric layer 174, and an upper electrode 176. The contact plugs 154 may be configured to electrically connect lower electrodes 172 of the capacitors 170 with the active regions 106 of the substrate 110.

Since there is a wide contact area between each of the contact pads 152 and the corresponding active region 106, the electrical connection between the contact plugs 154 and the active regions 106 through the contact pads 152 may have a reduced resistance.

Figure 2A:
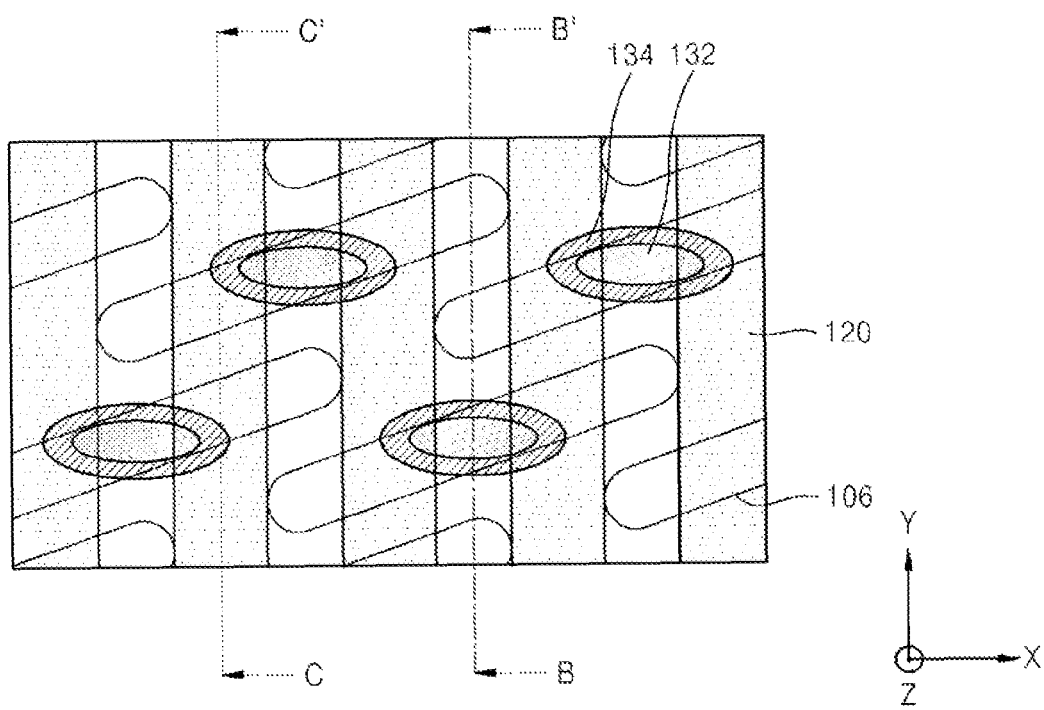
FIGS. 2A through 8C are plan and cross-sectional views illustrating a method of manufacturing a semiconductor device 100 according to exemplary embodiments of the inventive concept.

FIGS. 2A through 8C are plan and cross-sectional views illustrating a method of manufacturing a semiconductor device 100 according to exemplary embodiments of the inventive concept. A cross-sectional view taken along line B-B' of FIG. 2A is shown in FIG. 2B, and a cross-sectional view taken along line C-C' of FIG. 2A is shown in FIG. 2C. In the same manner, plan and cross-sectional views of the semiconductor device 100, which illustrate process operations, are shown in FIGS. 2A through 8C.

Figure 2B:
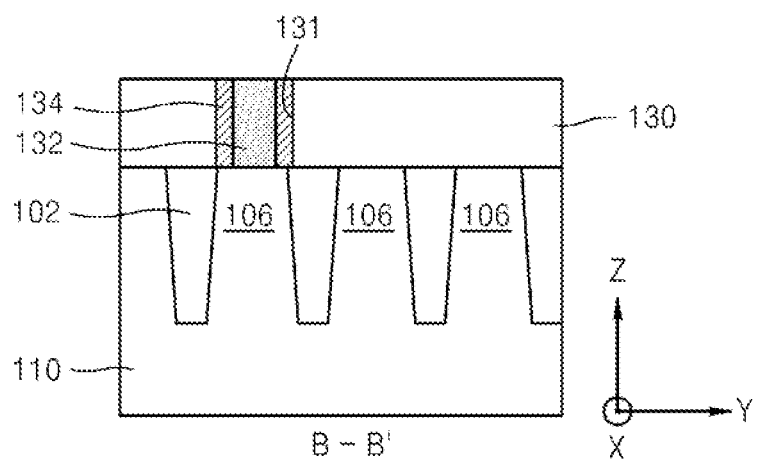
Figure 2C:
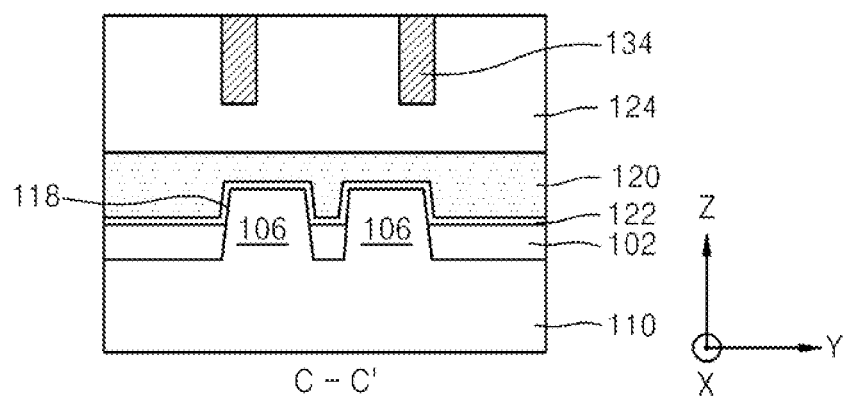

Referring to FIGS. 2A through 2C, isolation trenches (not shown) may be formed in a substrate 110 and filled with an insulating layer to form isolation regions 102. A plurality of active regions 106 may be defined in the substrate 110 by the isolation regions 102.

Thereafter, impurities may be implanted into an upper portion of the substrate 110 to form impurity regions (not shown) in upper portions of the respective active regions 106.

A buried insulating layer 130 may be formed to cover a top surface of the substrate 110. For example, the buried insulating layer 130 may be formed of an insulating material, such as silicon oxide, to a thickness of about 300 Å to about 800 Å.

Thereafter, a photoresist pattern (not shown) may be formed on the buried insulating layer 130, and the buried insulating layer 130 may be patterned using the photoresist pattern as an etch mask. Next, the substrate 110 may be etched using the patterned buried insulating layer 130 as an etch mask, to form a plurality of word line trenches 118. The plurality of word line trenches 118 have stepped bottom surfaces and may extend parallel to one another across the plurality of active regions 106. As shown in FIG. 2C, to form the plurality of word line trenches 118, the isolation regions 102 and the substrate 110 may be etched by two separate etching processes so that the isolation regions 102 can be formed to a different etching depth than the active regions 106.

A gate dielectric layer 122, a word line 120, and a capping layer 124 may be sequentially formed within the plurality of word line trenches 118. The capping layer 124 may be formed of a material that has a different etch selectivity than the buried insulating layer 130. For example, the capping layer 124 may be formed of an insulating material, such as silicon nitride.

Since the word line trenches 118 cross the active regions 106, the impurity regions formed in the upper portions of the active regions 106 on both sides of the word line 120 may function as source/drain regions (not shown).

Subsequently, portions of the buried insulating layer 130 and the capping layer 124 may be etched to form a plurality of bit line contact holes 131 that expose the active regions 106. Thereafter, bit line contact spacers 134 may be formed on sidewalls of the plurality of bit line contact holes 131. The plurality of bit line contact holes 131 may be filled with a conductive material to form a plurality of bit line contacts 132, which may be electrically connected to the active regions 106.

Figure 3A:
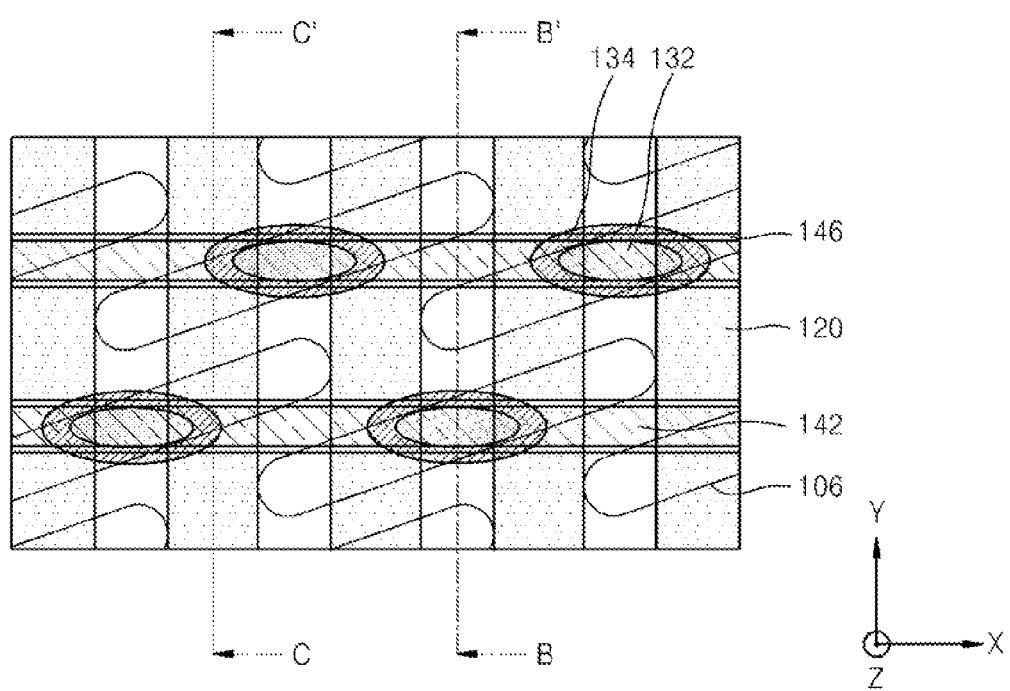
Figure 3B:
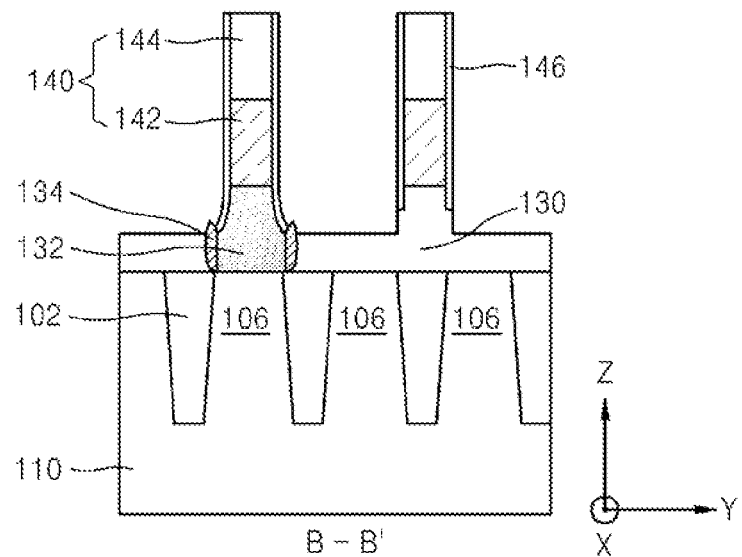
Figure 3C:
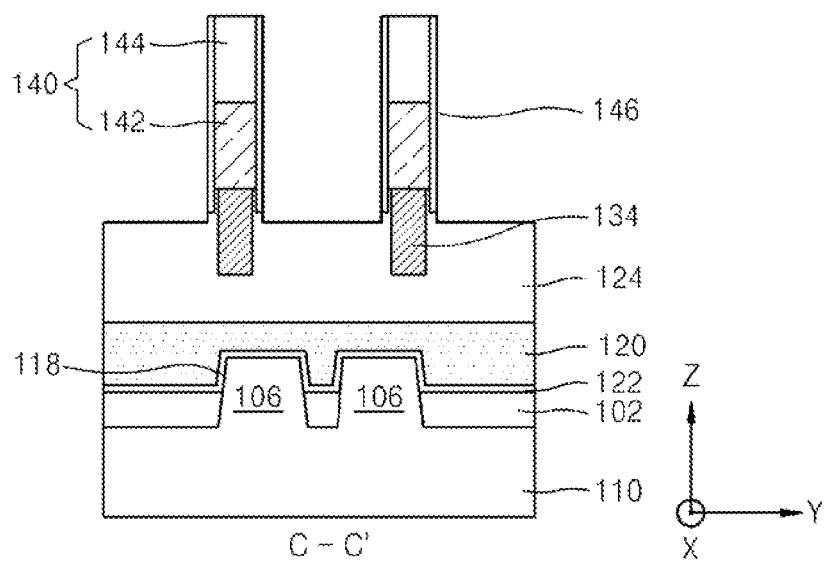

Referring to FIGS. 3A through 3C, a plurality of bit line stack structures 140 may be formed on the buried insulating layer 130 and the capping layer 124. Each bit line stack structure 140 may include a bit line 142 and a hard mask 144 that covers a top surface of the bit line 142. The plurality of bit line stack structures 140 may extend parallel to one another in the first, x-axis, direction of FIG. 3A at a predetermined angle with respect to word lines 120. For example, the predetermined angle may be a right angle with respect to the word lines 120. The bit line stack structures 140 may be electrically connected to the bit line contacts 132.

In exemplary embodiments, to form the plurality of bit line stack structures 140, a conductive layer for forming bit lines may be formed on the buried insulating layer 130, and a hard mask layer may be formed to cover the conductive layer. The hard mask layer may be formed to a greater thickness than the conductive layer. The hard mask layer may be patterned to form a plurality of hard masks 144, and the conductive layer may be etched using the plurality of hard masks 144 to form the plurality of bit lines 142.

During the above-described etching process, the buried insulating layer 130 and the bit line contact spacers 134 may be etched up to a predetermined thickness. For example, about a 100 Å to about a 200 Å thick portion of the buried insulating layer 130 not covered by bit lines 142 may be removed. Accordingly, a top surface of the buried insulating layer 130 may be exposed at a level below the bottom surfaces of the bit lines 142. In addition, since the bit line contacts 132 disposed under the bit lines 142 may be etched to a greater depth than the buried insulating layer 130 due to differences in their respective etch rates, portions of sidewalls of the bit line contacts 132 may be exposed.

Thereafter, first spacers 146 may be formed on sidewalls of the bit line stack structures 140. In portions where the bit line contacts 132 are formed, the first spacers 146 may be conformally formed on sidewalls of the hard mask 144, the bit lines 142, and the exposed sidewalls of the bit line contacts 132. The first spacers 146 may be used as an etch stop layer during a subsequent process or as a protection layer for protecting the plurality of bit line stack structures 140.

In exemplary embodiments, the formation of the first spacers 146 may include forming a first spacer layer (not shown) on the buried insulating layer 130 to cover the bit line stack structures 140, and anisotropically etching the first spacer layer to leave the first spacer layer on the sidewalls of the bit line stack structures 140 and the exposed sidewall portions of the bit line contacts 132. Thus, a plurality of first spacers 146 may be formed on both sidewalls of the bit line stack structure 140. The first spacers 146 may be conformally formed on the exposed sidewalls of the bit line contacts 132 and the bit line contact spacers 134. In exemplary embodiments, the first spacers 146 may be formed of silicon nitride to a thickness of about 30 Å to about 80 Å.

During the anisotropic etching process, the first spacer layer may be etched until the portions of the buried insulating layer 130 not covered by the bit line stack structures 140 are exposed. After that, the first spacer layer may be over-etched until up to a predetermined thickness of the exposed buried insulating layer 130 is removed. Thus, a top surface of the buried insulating layer 130 not covered by the bit line stack structures 140 may be lower than the bottom surfaces of the first spacers 146.

Figure 4A:
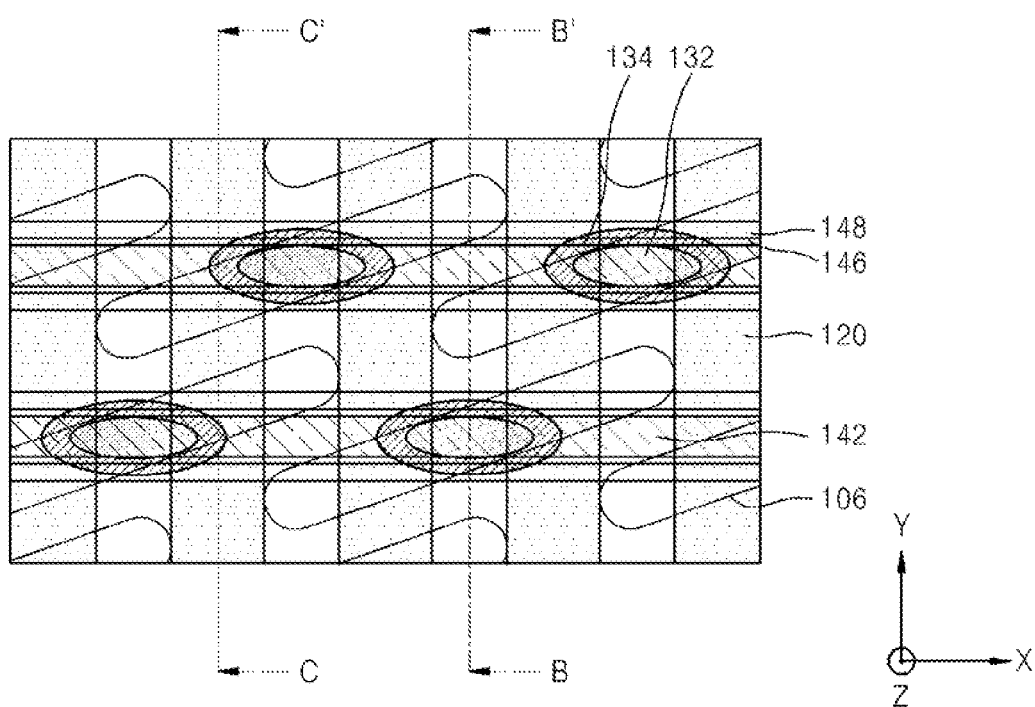
Figure 4B:
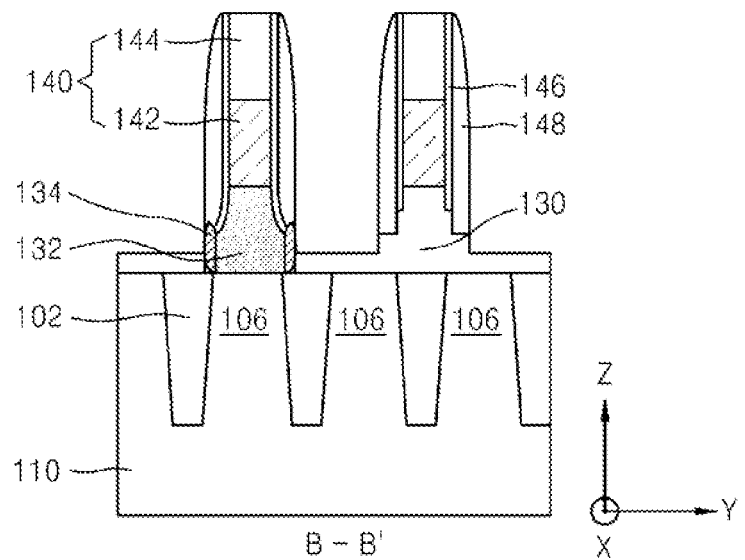
Figure 4C:
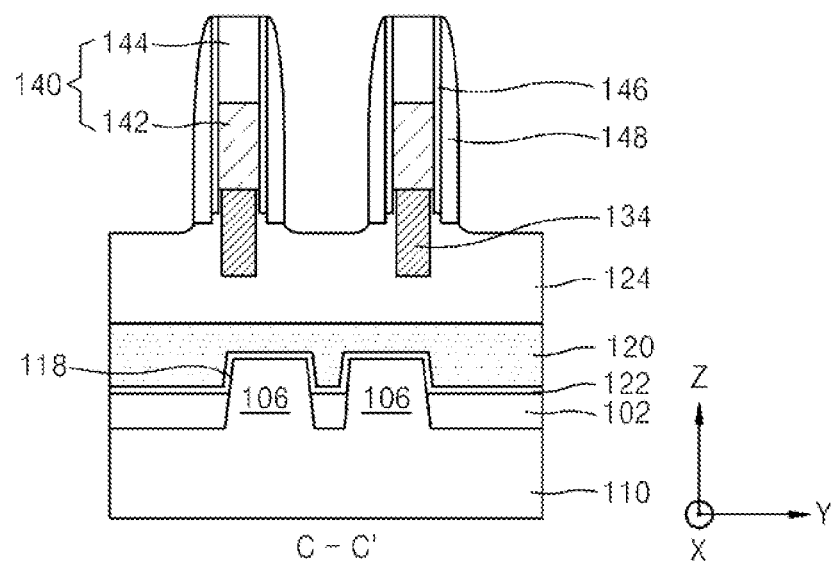

Referring to FIGS. 4A through 4C, second spacers 148 may be formed to cover the first spacers 146.

In this case, the second spacers 148 that cover the first spacers 146 may extend to the top surfaces of the bit line contact spacers 134. The second spacers 148 may serve as spacers for forming self-aligned contact plugs in a subsequent process. In exemplary embodiments, the second spacers 148 may be formed to a thickness of about 50 Å to about 200 Å. The second spacers 148 may be formed of silicon nitride.

The formation of the second spacers 148 may include forming a second spacer layer (not shown) on the buried insulating layer 130 to cover the plurality of first spacers 146 and the plurality of bit line stack structures 140. Subsequently, the second spacer layer may be anisotropically removed from the top surfaces of the bit line stack structures 140 and the top surface of the buried insulating layer 130 to leave the second spacers 148 on the sidewalls of the first spacers 146.

During the anisotropic etching process, the second spacer layer may be etched to expose portions of the buried insulating layer 130 not covered by the bit line stack structure 140 to form the second spacers 148 on the first spacers 146. Subsequently, up to a predetermined thickness of the exposed buried insulating layer 130 may be over-etched and further removed. For example, about 100 Å to about 200 Å thick portion of the buried insulating layer 130 may be removed. The exposed top surface of the buried insulating layer 130 between adjacent bit line stack structures 140 may be lower than the bottom surfaces of the second spacers 148.

Due to the two above-described over-etching processes, stepped portions (not shown) may be formed in portions of the buried insulating layer 130 disposed under the bit line stack structures 140. Also, the bottom surfaces of the first spacers 146 may be below the bottom surfaces of the bit lines 142, and the bottom surfaces of the second spacers 148 may be below the bottom surfaces of the first spacers 146. Accordingly, the second spacers 148 may extend downward from the sidewalls of the bit lines 142. Also, when contact holes 150 (see FIG. 5B) are formed during a subsequent process, the downward extension of the second spacers 148 may prevent an electrical short or electrical connection between contact plugs formed in the contact holes 150 and the bit lines 142.

Figure 5A:
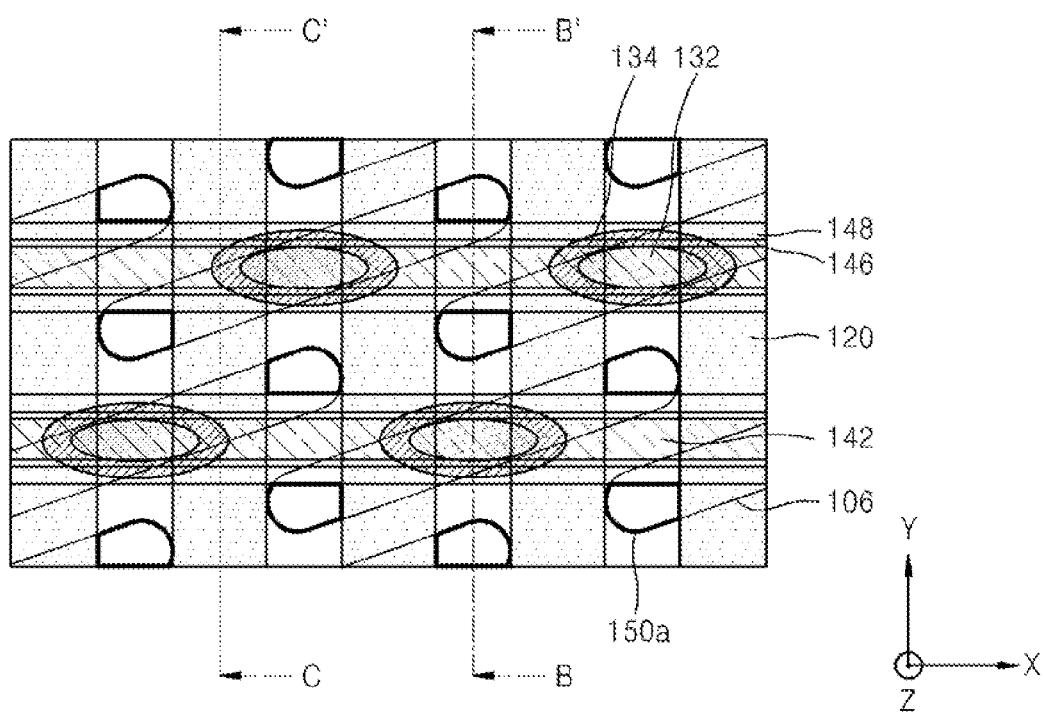
Figure 5B:
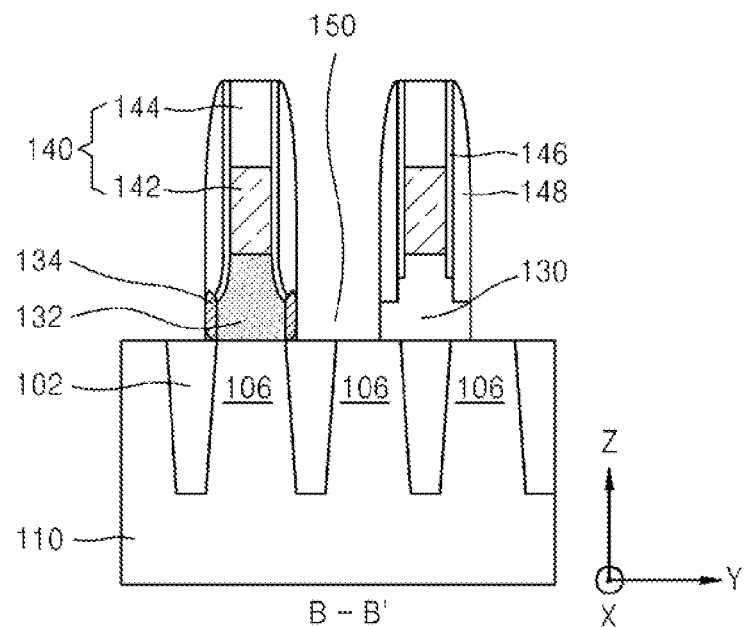
Figure 5C:
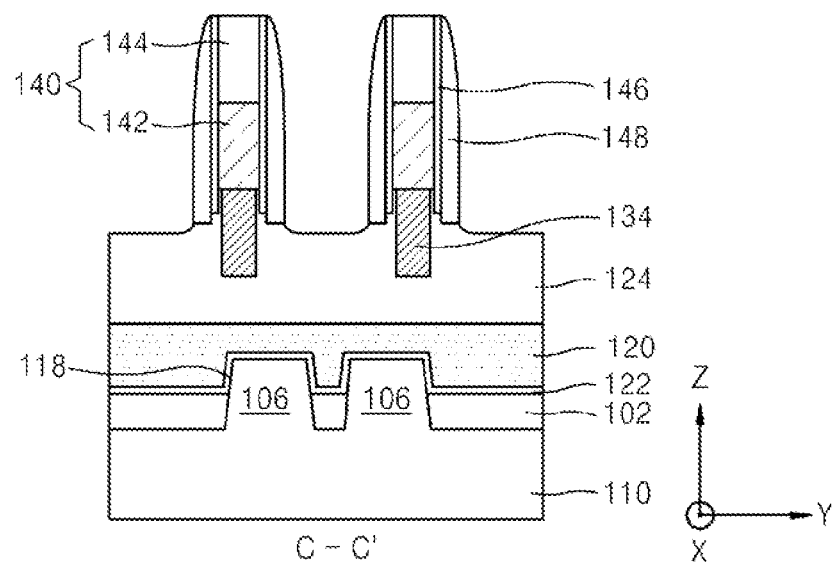

Referring to FIGS. 5A through 5C, the portions of the buried insulating layer 130 exposed between the bit line stack structures 140 may be removed to form contact holes 150 for forming self-aligned contact plugs in the buried insulating layer 130. Each of the contact holes 150 may extend in the first, x-axis, direction between adjacent second spacers 148. By forming the contact holes 150, the top surface of the substrate 110 may be exposed to expose the top surfaces of the isolation regions 102 and the top surfaces of the active regions 106.

Portions 150a of the active regions 106 that are exposed by the contact holes 150 are shown in FIG. 5A. Since the first spacers 146 and the second spacers 148 are sequentially formed on both sidewalls of the bit line stack structures 140, a distance between adjacent second spacers 148 may be less than a distance between adjacent bit line stack structures 140. Thus, an area of each exposed active region portions 150a may be less than an area of each exposed active region 106 between adjacent bit line stack structures 140 when the first and second spacers 146 and 148 are not formed.

Figure 6A:
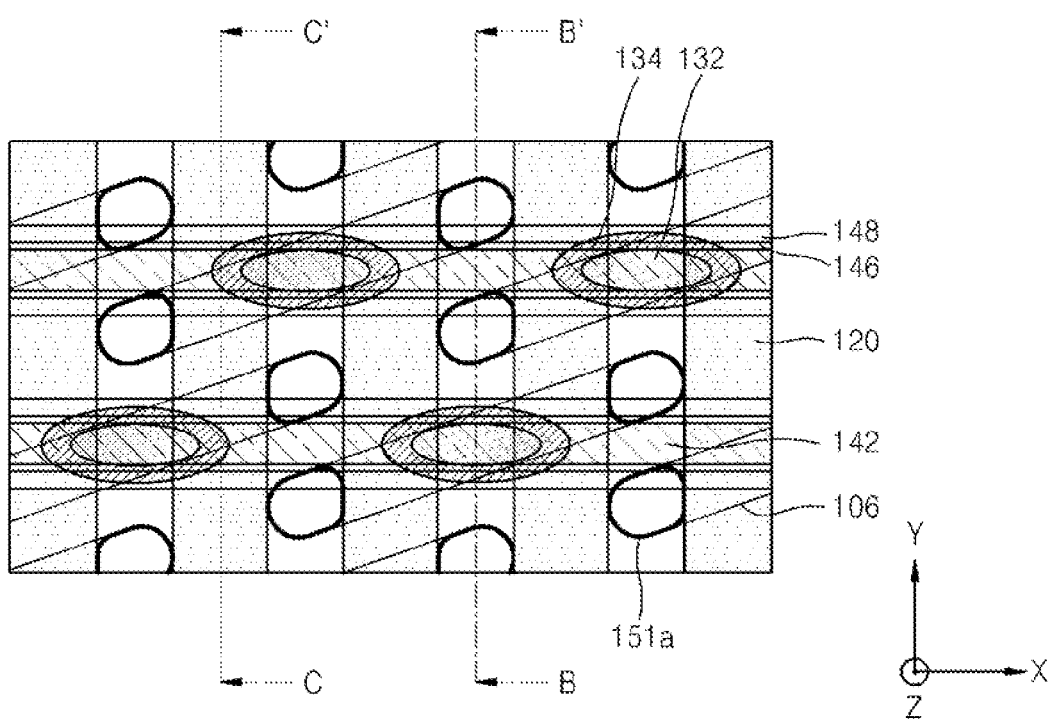
Figure 6B:
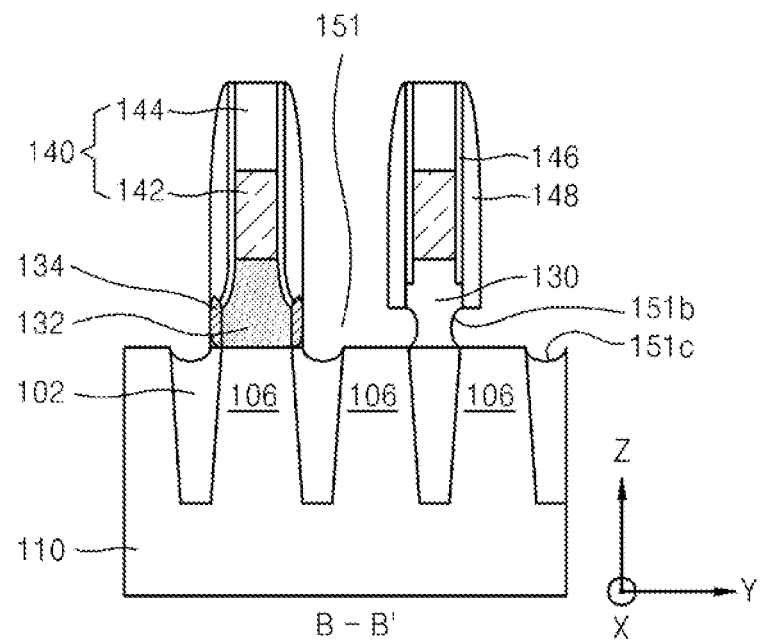
Figure 6C:
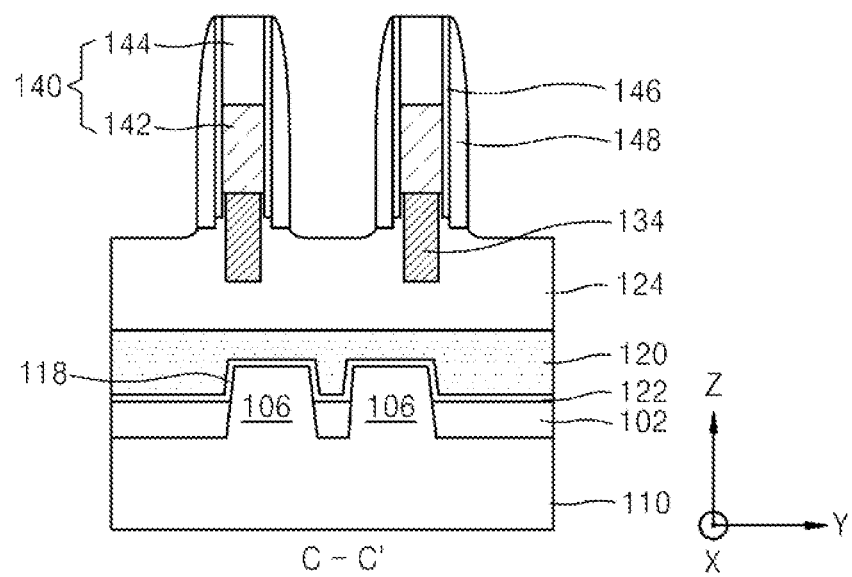

Referring to FIGS. 6A through 6C, sidewall portions of the buried insulating layer 130 exposed by the contact holes 150 may be further removed to form enlarged contact holes 151. Thus, the top surfaces of the active regions 106 covered with the buried insulating layer 130 may be exposed.

In exemplary embodiments, the removal process may be a wet etching process or a dry etching process. In addition, the removal process may be an isotropic etching process. The removal process may be performed using an etchant capable of selectively removing the buried insulating layer 130. For example, the removal process may be a wet etching process using ozone.

The bit line contact spacers 134 and the second spacers 148 may include a material that has an etch selectivity with respect to the buried insulating layer 130. Accordingly, the second spacers 148 may not be etched during the removal process, while portions of the buried insulating layer 130 exposed under the second spacers 148 may be isotropically etched to form first recesses 151b. The first recesses 151b may extend in the first, x-axis direction in which the bit lines 142 extend, and a width of the portions of the buried insulating layer 130 having the first recesses 151b may be less than a width of the portions of the buried insulating layer 130 not having the first recesses 151b.

Furthermore, after the bit line contact spacers 134 disposed under the second spacers 148 are exposed, the bit line contact spacers 134 may not be etched any longer, so the bit lime contacts 132 may not be exposed. Meanwhile, during the removal process, the exposed top surfaces of the isolation regions 102 may be etched together to form second recesses 151c.

The enlarged contact holes 151 may be defined by sidewalls and bottom surfaces of the second spacers 148, the first recesses 151b, the second recesses 151c, the sidewalls of the bit line contact spacers 134, and the top surfaces of the active regions 106. In some embodiments, the first recesses 151b may extend about 50 Å to about 200 Å A inward from the exposed sidewalls of the second spacers 148. Thus, a maximum width of the enlarged contact holes 151, measured in a second, y-axis direction perpendicular to the first direction, may be greater than a distance between adjacent second spacers 148.

Portions 151a of the active regions 106, which are exposed by the enlarged contact holes 151, are shown in FIG. 6A. Since the portions of the buried insulating layer 130 that were disposed under the first and second spacers 146 and 148 have been removed, portions of the active regions 106 that vertically overlap first and second spacers 146 and 148 may be exposed. Thus, an area of each exposed portion 151a of the active regions 106 may be substantially or approximately equal to an area of each active region 106 portion that may be exposed when the first and second spacers 146 and 148 are not formed.

Subsequently, to remove a native oxide layer (not shown) that may form on the exposed portions 151a of the active regions 106, a cleaning process using fluoric acid may be further performed.

Figure 7A:
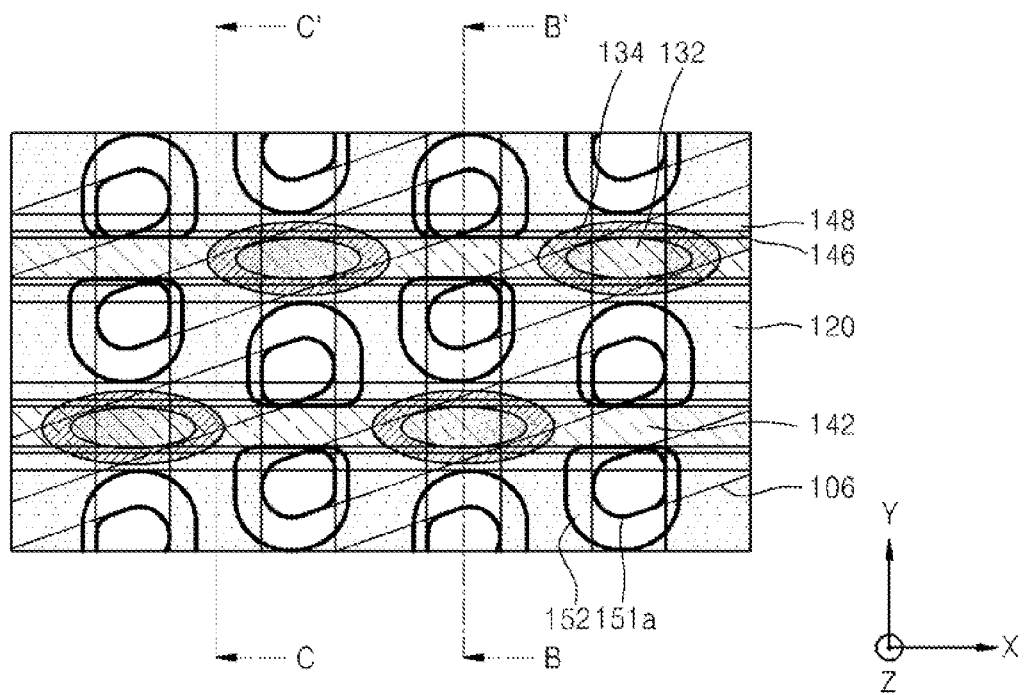
Figure 7B:
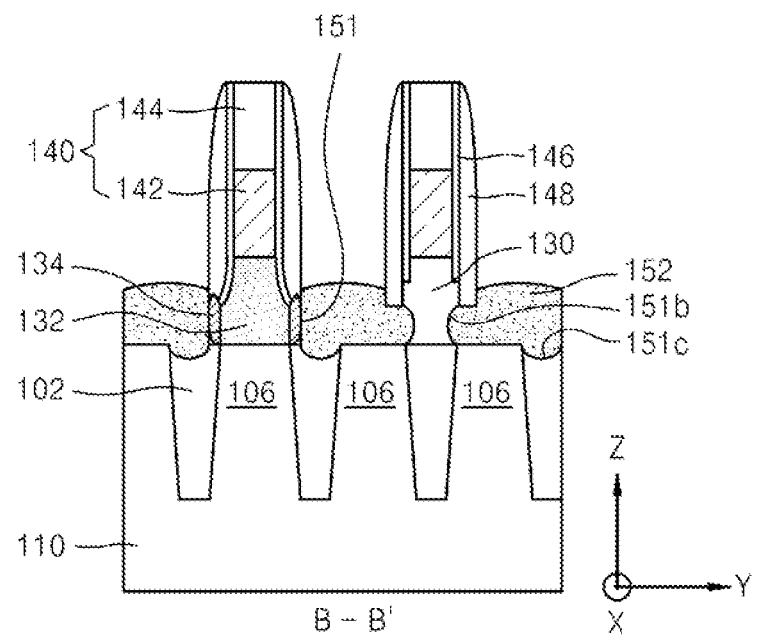
Figure 7C:
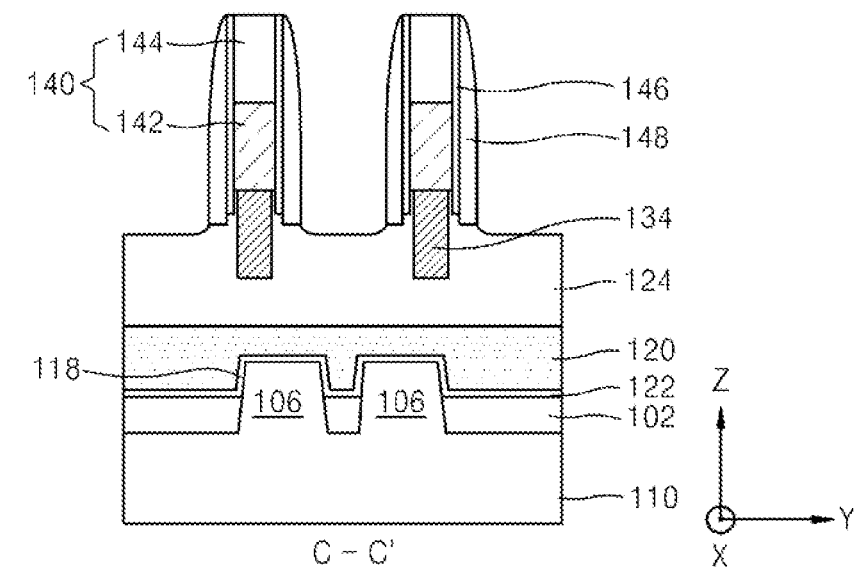

Referring to FIGS. 7A through 7C, contact pads 152 may be formed on the active region portions 151a exposed by the enlarged contact holes 151.

In exemplary embodiments, the contact pads 152 may be formed by a selective epitaxial growth (SEG) process using the exposed portions 151a of the active regions 106 as a seed layer. For example, contact pads 152 that include an epitaxial semiconductor layer may be grown to a predetermined height from the exposed portions 151a of the active regions 106. Thus, as shown in FIG. 7A, each contact pad 152 may be formed as an island type on the corresponding exposed portions 151a of the active regions 106. The contact pads 152 may include an epitaxial semiconductor layer that has the same crystal orientation as the substrate 110. For example, the contact pads 152 may be formed of single crystalline silicon, single crystalline germanium, or single crystalline silicon germanium. However, materials that form the contact pads 152 are not limited thereto and may differ from the material forming the substrate 110. In exemplary embodiments, the contact pads 152 may be formed to a height of about 150 Å to about 400 Å from the top surfaces of the active regions 106.

The contact pads 152 may be in contact with top surfaces of the exposed portions 151a of the active regions 106, the sidewalls of the enlarged contact holes 151, and the sidewalls of the second spacers 148. For example, the contact pads 152 may be formed on inner walls of the first and second recesses 151b and 151c within the enlarged contact holes 151. In a present embodiment, by controlling the grown height of the contact pads 152, the contact pads 152 may have top surfaces that are higher than the bottom surfaces of the second spacers 148. Thus, upper portions of the contact pads 152 may be interposed between adjacent second spacers 148, while lower portions of the contact pads 152 may be in contact with the bit line contact spacers 134 and the inner walls of the first recesses 151b. Since the lower portions of the contact pads 152 are formed within the enlarged contact holes 151, each lower portion of the contact pads 152 may have a width greater than a distance between adjacent second spacers 148.

In exemplary embodiments, the contact pads 152 may contain impurities that are implanted after the contact pads 152 are formed, or that are doped during an SEG process that forms the contact pads 152. Contact pads 152 that contain impurities may improve electrical conductivity between the active regions 106 and contact plugs 154 (see FIG. 8B) that will be formed on the contact pads 152 during a subsequent process.

Since the contact pads 152 are in contact with the exposed portions 151a of the active regions 106, contact areas between the active regions 106 and the contact pads 152 may increase. As a result, line resistance of the contact plugs 154 may be reduced. Also, since the contact pads 152 are self-aligned due to the enlarged contact holes 151 and the second spacers 148, failures caused by misalignment, which may occur when contact holes (not shown) are formed and contact plugs are formed to fill the contact holes, instead of forming the contact pads 152 by using an SEG process, may be prevented. Furthermore, even if some contact pads 152 are higher due to an increase in height dispersion among the contact pads 152, the second spacers 148 may prevent an electrical short or electrical connection between the bit lines 142 and the contact pads 152.

Figure 8A:
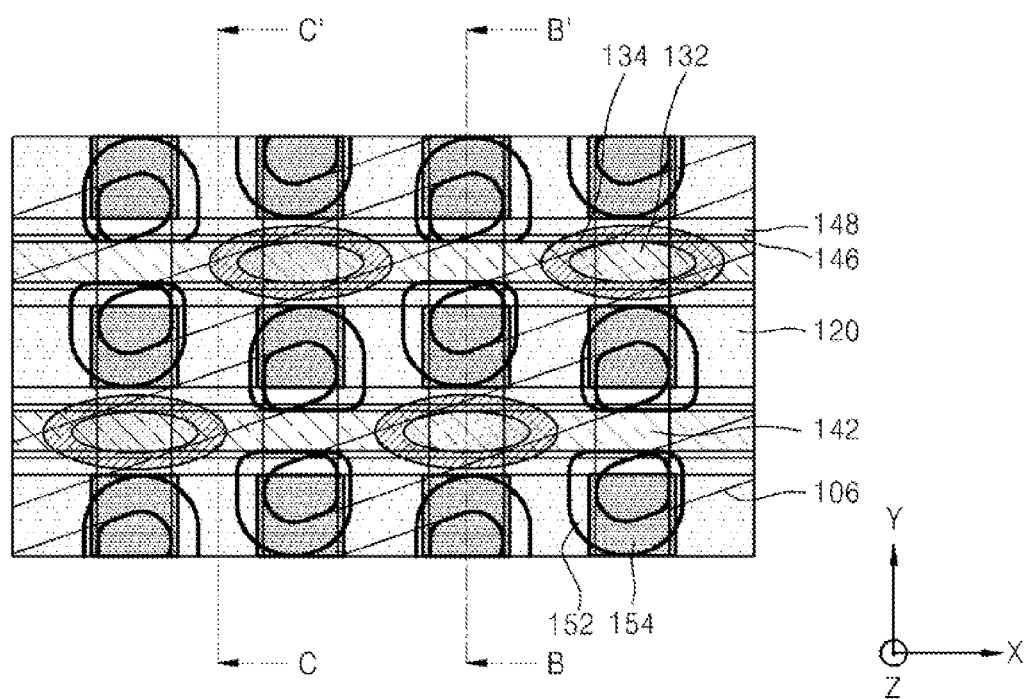
Figure 8B:
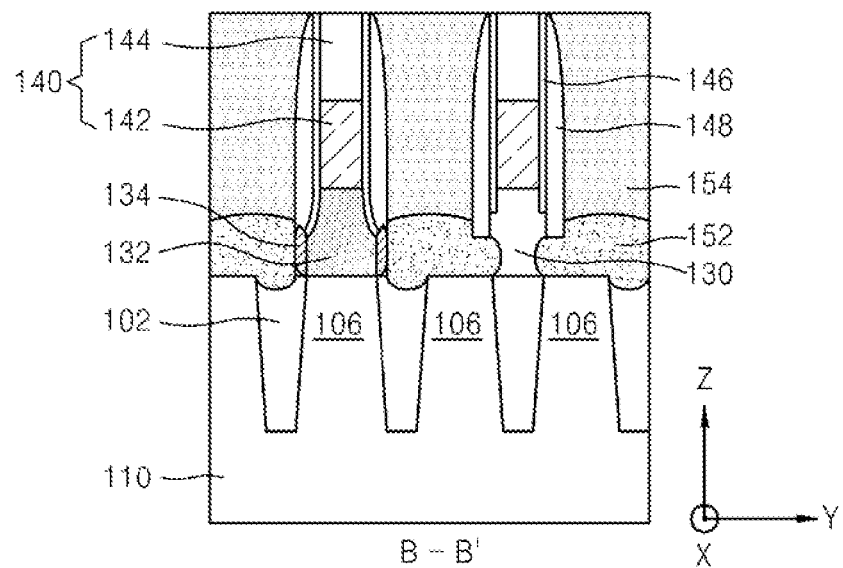
Figure 8C:
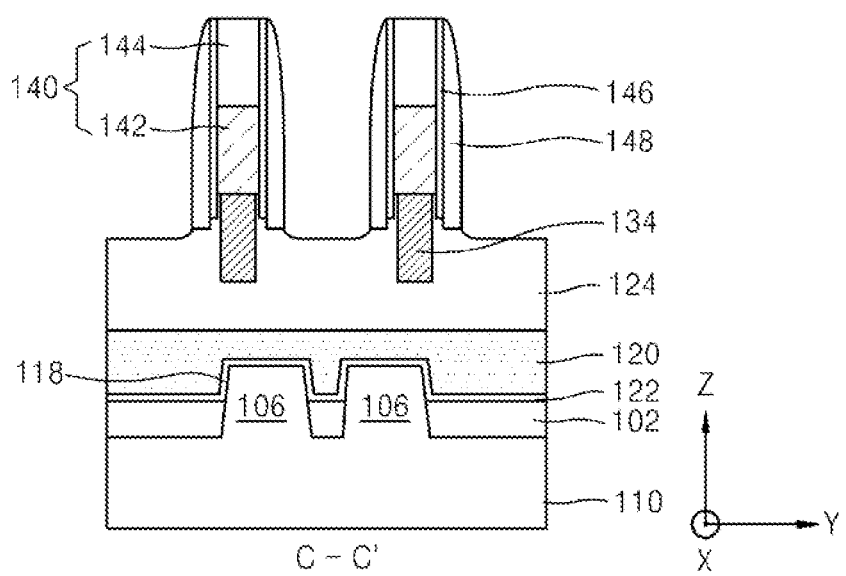

Referring to FIGS. 8A through 8C, the contact plugs 154 may be formed on the sidewalls of the second spacers 148 and the contact pads 152.

In exemplary embodiments, a conductive layer (not shown) may be formed on the contact pads 152, the bit line stack structures 140, and the second spacers 148, and planarized until top surfaces of the bit line stack structures 140 are exposed. A mask layer (not shown) that extends in the second, y-axis, direction may be formed on top surfaces of the conductive layer and the bit line stack structures 140. The conductive layer may be then patterned using the mask layer and the bit line stack structures 140 as an etch mask, to form the contact plugs 154.

For example, both sidewalls of the contact plugs 154 may self-align with the second spacers 148 and other sidewalls (i.e., inner sidewalls) of the contact plugs 154 may be formed during the patterning process.

Referring back to FIGS. 1A through 1C, an insulating material may be deposited on the resultant structure to form a first insulating interlayer 160 that covers the plurality of bit line stack structures 140 and the plurality of contact plugs 154. A mold layer (not shown) may be formed on the first insulating interlayer 160, and both the mold layer and the first insulating interlayer 160 may be partially etched to form a plurality of storage node holes (not shown) that expose a top surface of each of the plurality of contact plugs 154. A plurality of cylindrically shaped lower electrodes 172 may be formed that conformally extend on sidewalls and bottom surfaces of the plurality of storage node holes. After removing the mold layer, a dielectric layer 174 and upper electrodes 176 may be formed on the plurality of lower electrodes 172. The lower electrode 172, the dielectric layer 174, and each of the upper electrodes 176 may constitute a capacitor 170.

The semiconductor device 100 may be completed through the above-described processes.

In the semiconductor device 100, since there is a wide contact area between the contact pad 152 and the active region 106, resistance may be reduced when the contact plug 154 is electrically connected to the active region 106 via the contact pad 152.

Figure 9:
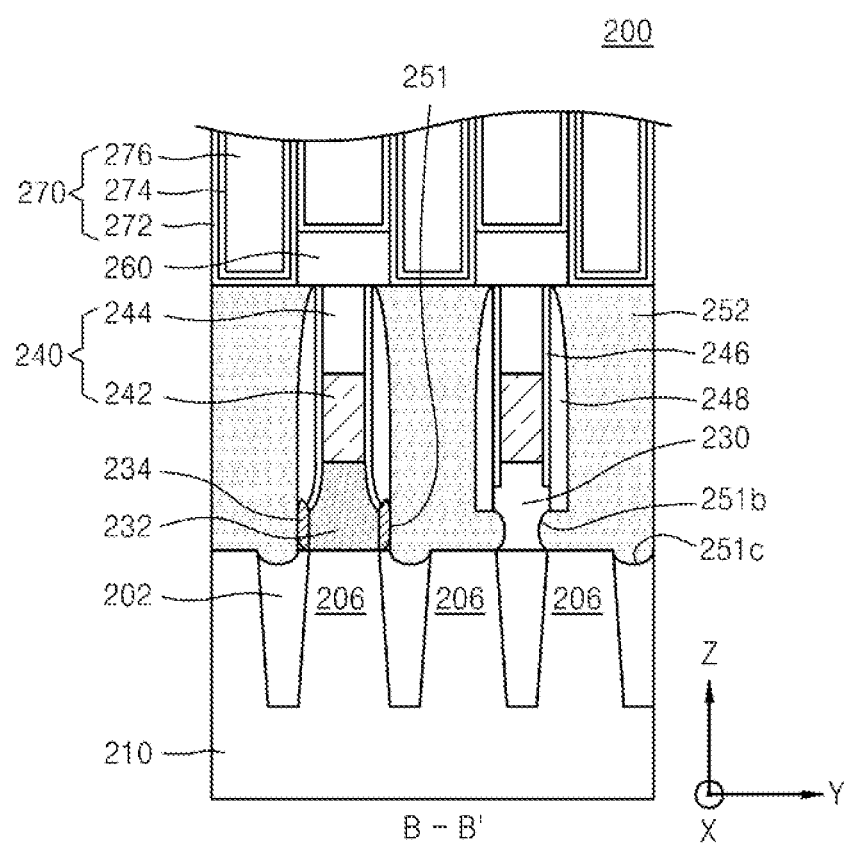
FIG. 9 is a cross-sectional view illustrating a method of manufacturing a semiconductor device according to exemplary embodiments of the inventive concept.

FIG. 9 is a cross-sectional view illustrating a method of manufacturing a semiconductor device 200 according to exemplary embodiments of the inventive concept. Since a method of a present embodiment is similar to the method of manufacturing the semiconductor device 100 described above with reference to FIGS. 1A through 8C, differences therebetween will chiefly be described below.

To begin with, the processes described with reference to FIGS. 1A through 6C may be performed. Thus, a buried insulating layer 230 interposed with bit line contacts 232 and bit line contact spacers 234 may be formed on a substrate 210, and bit line stack structures 240 may be formed by sequentially stacking bit lines 242 and a hard mask 244 on the buried insulating layer 230. Subsequently, enlarged contact holes 251 may be formed between adjacent bit line stack structures 240. In this case, first recesses 251b may be formed on sidewalls of the buried insulating layer 230, and second recesses 251c may be formed in isolation regions 202. The enlarged contact holes 251 may be wider due to the first recesses 251b under bottom surfaces of first and second spacers 246 and 248 sequentially stacked on the sidewalls of the bit line stack structures 240. In addition, the enlarged contact holes 251 may expose top surfaces of active regions 206.

Referring to FIG. 9, contact pads 252 may be formed between the bit line stack structures 240 that contact the active regions 206.

To form the contact pads 252, a conductive layer (not shown) may be formed to fill the enlarged contact holes 251, and planarized until top surfaces of the bit line stack structures 240 are exposed. Thereafter, a mask layer (not shown) may be formed on the bit line stack structures 240 and the conductive layer that extends in a second, y-axis, direction of FIG. 9 perpendicular to a first, x-axis, direction in which the bit line stack structures 240 extend. After that, the conductive layer may be patterned using the bit line stack structures 240 and the mask layer as an etch mask, to form the contact pads 252. Thus, lower portions of the contact pads 252 may be in contact with the active regions 206 and self-aligned with sidewalls of the enlarged contact holes 251, while upper portions of the contact pads 252 may be formed between sidewalls of adjacent second spacers 248. Top surfaces of the contact pads 252 may be substantially coplanar with the top surfaces of the bit line stack structures 240.

In exemplary embodiments, the conductive layer may be formed by depositing a doped polycrystalline semiconductor layer using a chemical vapor deposition (CVD) process, a low-pressure CVD (LP-CVD) process, or an atomic layer deposition (ALD) process. For example, the conductive layer may include a doped poly-Si layer.

Subsequently, a first insulating interlayer 260 may be formed to cover the bit line stack structures 240 and the contact pads 252, and capacitors 270, each of which includes a lower electrode 272, a dielectric layer 274, and an upper electrode 276, may be formed on the first insulating interlayer 260.

In the semiconductor device 200, since the lower portion of the contact pad 252 is formed within the enlarged contact hole 251, a contact area between the contact pad 252 and the active region 206 may increase.

FIGS. 10A through 10F are cross-sectional views illustrating a method of manufacturing a semiconductor device 300 according to exemplary embodiments of the inventive concept. Since a method of a present embodiment is similar to the method of manufacturing the semiconductor device 100 described with reference to FIGS. 1A through 8C, differences therebetween will chiefly be described.

Figure 10A:
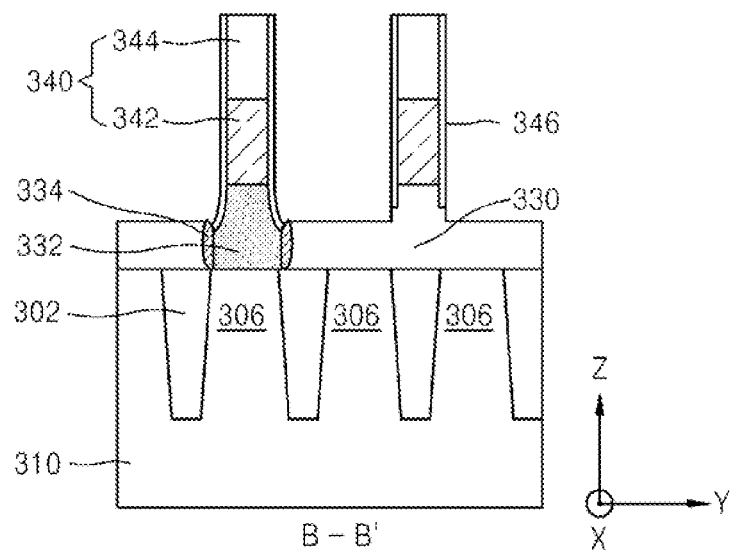
FIGS. 10A through 10F are cross-sectional views illustrating a method of manufacturing a semiconductor device according to exemplary embodiments of the inventive concept.

Referring to FIG. 10A, first spacers 346 may be formed on both sidewalls of bit line stack structures 340 formed on a substrate 310. To form the bit line stack structures 340, a conductive layer (not shown) may be patterned using a hard mask 344 as an etch mask, to form bit lines 342. Meanwhile, portions of a buried insulating layer 330 not covered by bit lines 342 may be over-etched form top surfaces of the portions of the buried insulating layer 330 below the bottom surfaces of bit lines 342. Subsequently, a first spacer layer (not shown) that covers sidewalls of the bit line stack structures 340 may be formed and anisotropically etched to form first spacers 346 on the sidewalls of the bit line stack structures 340.

Figure 10B:
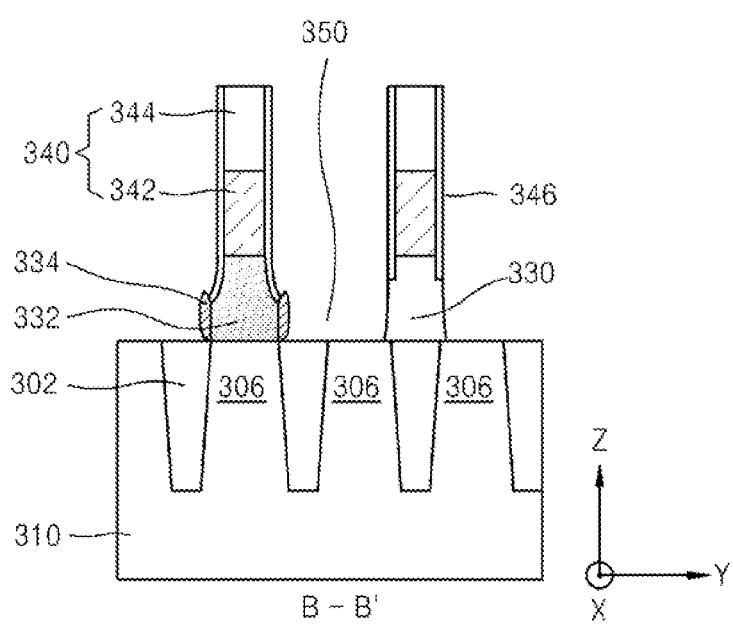

Referring to FIG. 10B, exposed portions of the buried insulating layer 330 may be removed using the bit line stack structures 340 and the first spacers 346 as an etch mask, to expose a top surface of the substrate 310. In this case, sidewalls of the buried insulating layer 330 may be formed substantially vertically downward along the sidewalls of the first spacers 346. Contact holes 350 may be defined by the exposed top surface of the substrate 310 and the exposed sidewalls of the buried insulating layer 330. In addition, as shown in FIG. 10B, when sidewalls of the bit line contact spacers 334 are exposed during the removal process, the exposed sidewalls of the bit line contact spacers 334 may also define the contact holes 350. Depending on the thickness of the first spacers 346 and/or the width of the bit line stack structures 340, some portions of the top surfaces of the active regions 306 may be exposed by the contact holes 350, while other portions of the top surfaces of the active regions 306 may be covered by the buried insulating layer 330.

Figure 10C:
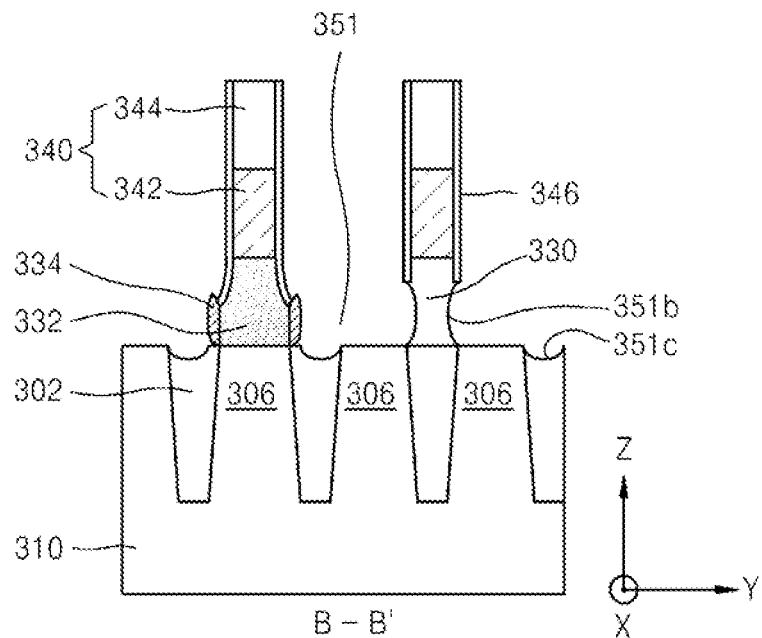

Referring to FIG. 10C, the exposed sidewalls of the buried insulating layer 330 may be further removed to form enlarged contact holes 351. To form the enlarged contact holes 351, first recesses 351b may be formed in the exposed sidewalls of the buried insulating layer 330 using an isotropic etching process. The first recesses 351b may extend in a first, x-axis, direction in which the bit line stack structures 340 extend. In addition, to form the enlarged contact holes 351, second recesses 351c may be formed in the exposed portions of the isolation regions 302.

The enlarged contact holes 351 may further expose portions of the top surfaces of the active regions 306 previously covered by the buried insulating layer 330. For example, since the first spacers 346 are formed to a thickness of about 30 Å to about 80 Å, even if no isotropic etching process is performed, the portions of the top surfaces of the active regions 306 previously covered by the buried insulating layer 330 may be wholly exposed.

The exposed bit line contact spacers 334 may not be etched, and the bit line contacts 332 may not be exposed during a removal process for forming the enlarged contact holes 351.

Figure 10D:
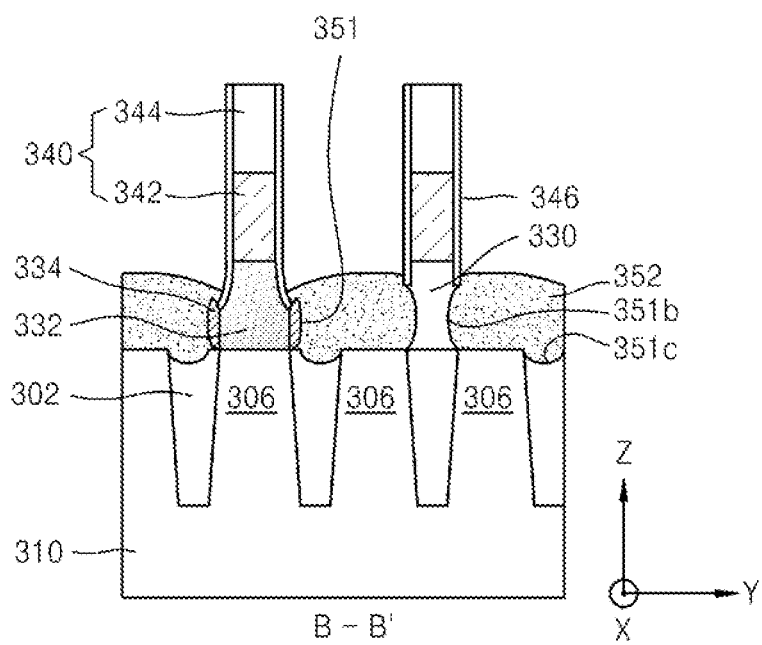

Referring to FIG. 10D, an SEG process may be performed using the exposed top surfaces of the active regions 306 as a seed layer, to form a plurality of contact pads 352 within the enlarged contact holes 351. Accordingly, bottom surfaces of the respective contact pads 352 may be in contact with the exposed active regions 306, and the contact pads 352 may include an epitaxial semiconductor layer. By increasing the areas of the active regions 306 that may be used as the seed layer of the SEG process, the contact pads 352 may have a more uniform height dispersion.

In exemplary embodiments, the contact pads 352 may be in contact with portions of the sidewalls of the first spacers 346. In addition, top surfaces of the contact pads 352 may be formed below the bottom surfaces of the bit lines 342. For example, the contact pads 352 may be formed to have a height of about 150 Å to about 300 Å. However, the height of the contact pads 352 is not limited thereto.

Figure 10E:
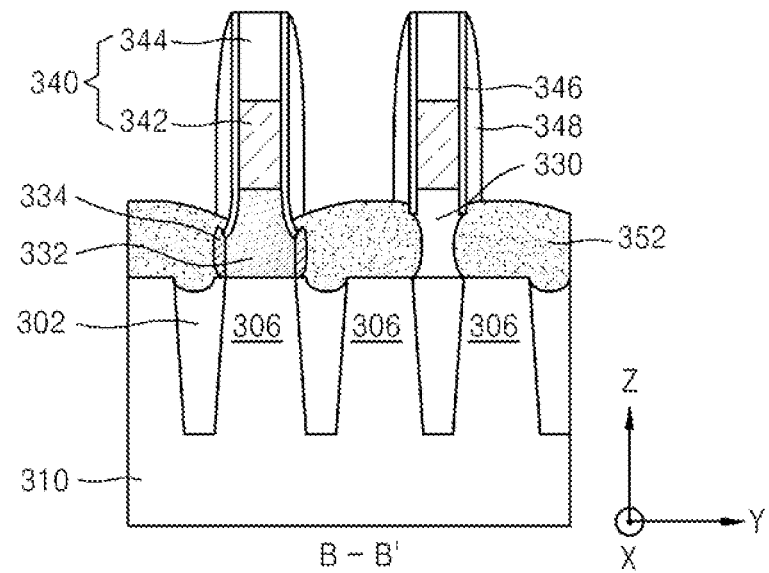

Referring to FIG. 10E, second spacers 348 may be formed on sidewalls of the first spacers 346. In exemplary embodiments, the second spacers 348 may extend downward along the sidewalls of the first spacers 346, and bottom surfaces of the second spacers 348 may be in contact with portions of the top surfaces of the contact pads 352.

To form the second spacers 348, a second spacer layer (not shown) that covers the bit line stack structures 340 and the first spacers 346 may be formed and partially removed from the contact pads 352 using an anisotropic etching process, and the second spacers 348 may be left on the sidewalls of the first spacers 346.

FIG. 10E shows a case where the anisotropic etching process is performed until the top surfaces of the contact pads 352 are exposed. However, in another case, even if the top surfaces of the contact pads 352 are exposed, the anisotropic etching process may continue to remove a predetermined thickness of the upper portions of the contact pads 352. Thus, even if there is a large height dispersion among the plurality of contact pads 352, all the contact pads 352 may be exposed, which may increase the contact areas between the contact pads 352 and the contact plugs 354 that will be formed on the contact pads 352 during a subsequent process.

Figure 10F:
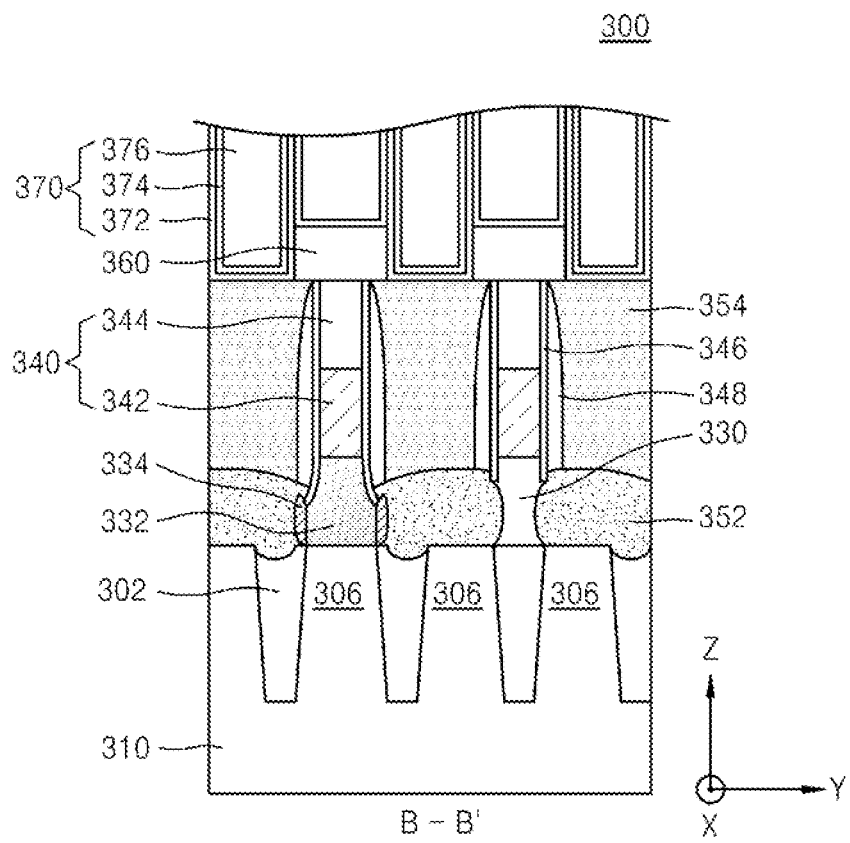

Referring to FIG. 10F, contact plugs 354 may be formed on the second spacers 348 and the contact pads 352.

In exemplary embodiments, a conductive layer (not shown) may be formed on the bit line stack structures 340, the second spacers 348, and the contact pads 352, and planarized until top surfaces of the bit line stack structures 340 are exposed. Thereafter, a mask layer (not shown) may be formed on the bit line stack structures 340 and the conductive layer that extends in a second, y-axis, direction perpendicular to the first, x-axis direction in which the bit line stack structures 340 extend. The conductive layer may be patterned using the mask layer and the bit line stack structures 340 as an etch mask, to form contact plugs 354 on the contact pads 352.

For example, both sidewalls of the contact plugs 354 may be self-aligned with the second spacers 348, and other sidewalls of the contact plugs 354 may be exposed during the patterning process.

Subsequently, a first insulating interlayer 360 may be formed to cover the bit line stack structures 340 and the contact plugs 354, and capacitors 370 that each include a lower electrode 372, a dielectric layer 374, and an upper electrode 376, may be formed on the first insulating interlayer 360.

The semiconductor device 300 may be completed by performing the above-described processes.

Hereinafter, the semiconductor device 300 manufactured using the method described with reference to FIGS. 10A through 10F will be described.

The semiconductor device 300 may include a plurality of bit line stack structures 340, first and second spacers 346 and 348, contact pads 352, contact plugs 354, and capacitors 370.

The first and second spacers 346 and 348 may be sequentially formed on sidewalls of the bit line stack structures 340 formed by stacking bit lines 342 and a hard mask 344. The first spacers 346 may be conformally formed along sidewalls of the hard mask 344 and the bit lines 342, and extend to top surfaces of bit line contacts 332 disposed under the bit lines 342. The second spacers 348 may be formed on the first spacers 346, and bottom surfaces of the second spacers 348 may be above the bottom surfaces of the first spacers 346.

The contact pads 352 may be interposed in a buried insulating layer 330 over active regions 306 of a substrate 310. Top surfaces of the contact pads 352 may be above the bottom surfaces of the first spacers 346 and in contact with sidewalls of the second spacers 346. The top surfaces of the contact pads 352 may be in contact with the bottom surfaces of the second spacers 348, and upper portions of sidewalls of the contact pads 352 may not contact the sidewalls of the second spacers 348. A width of the contact pads 352 measured in the second, y-axis, direction may be greater than a width of the contact pads 352 measured between adjacent second spacers 348.

Figure 11:
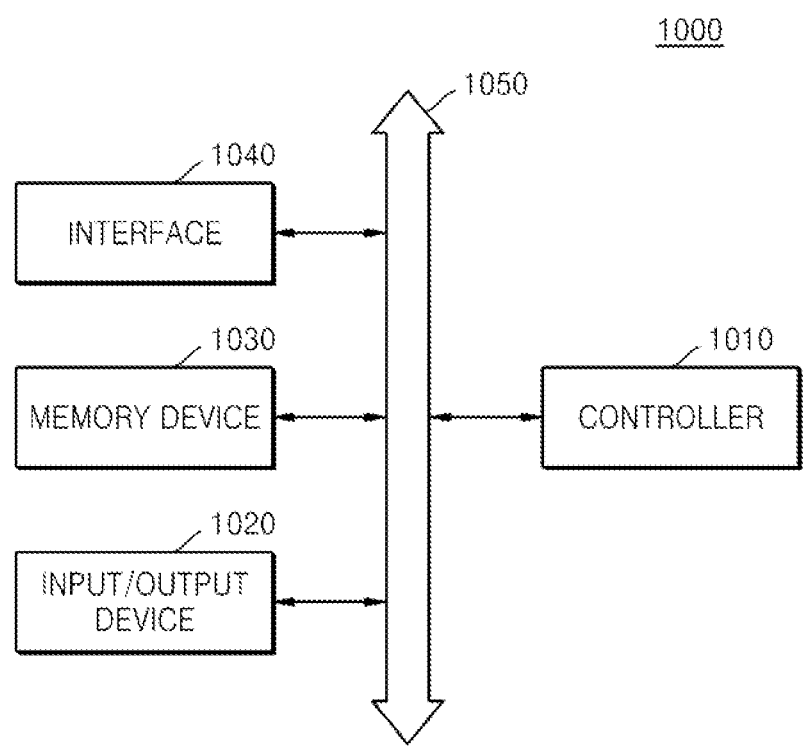
FIG. 11 is a diagram of a system including a semiconductor device according to an exemplary embodiment of the inventive concept.

FIG. 11 is a diagram of a system 1000 including a semiconductor device according to an exemplary embodiment of the inventive concept.

The system 1000 may include a controller 1010, an input/output (I/O) device 1020, a memory device 1030, and an interface 1040. The system 1000 may be a mobile system or a system configured to transmit or receive information. In some embodiments, the mobile system may be a personal digital assistant (PDA), a portable computer, a web tablet, a wireless phone, a mobile phone, a digital music player, or a memory card. The controller 1010 may be configured to execute a program in the system 1000. The controller 1010 may include a microprocessor (MP), a digital signal processor (DSP), a microcontroller (MC), or a similar apparatus thereto. The I/O device 1020 may be used to input or output data to or from the system 1000. The system 1000 may be connected to and exchange data with an external device, such as a personal computer (PC) or a network, using the I/O device 1020. The I/O device 1020 may be, for example, a keypad, a keyboard, or a display device.

The memory device 1030 may store program code or data required for operations of the controller 1010 or store data processed by the controller 1010. The memory device 1030 may include a semiconductor device according to embodiments of the inventive concept. For example, the memory device 1030 may include the semiconductor devices 100, 200, and 300 shown in FIGS. 1A through 10F.

The interface 1040 may be a data transmission path between the system 1000 and other external devices. The controller 1010, the I/O device 1020, the memory device 1030, and the interface 1040 may communicate with one another through a bus 1050. The system 1000 may be used for a mobile phone, a media player 3 (MP3) player, a navigation device, a portable multimedia player (PMP), a solid-state disk (SSD), or household appliances.

While embodiments of the inventive concept has been particularly shown and described with reference to exemplary embodiments thereof, it will be understood that various changes in form and detail may be made therein without departing from the spirit and scope of the following claims.

What is claimed is:

1. A semiconductor device comprising:
   a plurality of bit lines that intersect an active region on a substrate and extend in a first direction;
   a contact pad disposed on the active region between adjacent bit lines among the plurality of bit lines;
   a contact plug disposed on the contact pad between adjacent bit lines among the plurality of bit lines; and
   a plurality of spacers disposed on sidewalls of the plurality of bit lines,
   wherein an upper portion of the contact pad is interposed between adjacent spacers among the plurality of spacers, and a lower portion of the contact pad has a width greater than a distance between adjacent spacers among the plurality of spacers.

2. The device of claim 1, wherein the contact pad includes an epitaxial semiconductor layer and is self-aligned with a sidewall of at least one of the plurality of spacers.

3. The device of claim 1, wherein the contact pad has a first portion in contact with the sidewall of the at least one of the plurality of spacers.

4. The device of claim 1, wherein the contact pad has a second portion disposed under the at least one of the plurality of spacers, wherein the second portion overlaps the at least one of the plurality of spacers in a vertical direction.

5. The device of claim 1, wherein a bottom surface of the at least one of the plurality of spacers is disposed below a bottom surface of the plurality of bit lines.

6. The device of claim 1, further comprising a buried insulating layer disposed between the substrate and the plurality of bit lines; and
   a bit line contact interposed in the buried insulating layer and configured to electrically connect the active region with at least one of the plurality of bit lines,
   wherein the contact pad has a rounded sidewall that protrudes in a second direction perpendicular to the first direction, and is in contact with the buried insulating layer.

7. A semiconductor device comprising:
   a buried insulating layer disposed on a substrate;
   a plurality of bit lines disposed on the buried insulating layer that extend in a first direction, the plurality of bit lines having sidewalls upon which first spacers are disposed;
   a plurality of contact pads interposed in the buried insulating layer between adjacent bit lines among the plurality of bit lines, each of the plurality of contact pads having a width greater than a distance between adjacent first spacers among the plurality of spacers; and
   a plurality of contact plugs respectively disposed on the plurality of contact pads between adjacent bit lines among the plurality of bit lines,
   wherein the buried insulating layer includes a first recess that extends in the first direction,
   wherein the plurality of contact pads are in contact with an inner wall of the first recess.

8. The device of claim 7, further comprising an isolation layer disposed on the substrate that defines an active region of the substrate,
   wherein the isolation layer includes a second recess disposed in a portion thereof not covered by the buried insulating layer, wherein each of the plurality of contact pads is in contact with an inner wall of the second recess.

9. The device of claim 7, wherein an upper portion of a sidewall of at least one of the plurality of contact pads is in contact with a sidewall and bottom surface of a corresponding first spacer among the plurality of spacers.

10. The device of claim 7, further comprising a plurality of second spacers, each second spacer being disposed between at least one of the plurality of bit lines and a corresponding first spacer among the plurality of spacers,
wherein bottom surfaces of the first spacers are below bottom surfaces of the plurality of second spacers.

11. The device of claim 7, further comprising a plurality of second spacers, each second spacer being disposed between at least one of the plurality of bit lines and a corresponding first spacer among the plurality of spacers,
wherein bottom surfaces of the first spacers are above bottom surfaces of the plurality of second spacers,
wherein each of the plurality of contact pads are spaced apart from the first spacers.

12. The device of claim 7, wherein each of the plurality of contact pads includes an epitaxial semiconductor layer.

13. The device of claim 7, wherein each of the plurality of contact pads includes a doped polycrystalline semiconductor layer.

14. A semiconductor device comprising:
a buried insulating layer disposed on a substrate;
a plurality of bit lines disposed on the buried insulating layer that extend in a first direction, the plurality of bit lines having sidewalls upon which first spacers are disposed;
a plurality of contact pads interposed in the buried insulating layer between adjacent bit lines among the plurality of bit lines, each of the plurality of contact pads having a width greater than a distance between adjacent first spacers; and
a plurality of contact plugs respectively disposed on the plurality of contact pads between adjacent bit lines among the plurality of bit lines,
wherein an upper portion of a sidewall of at least one of the plurality of contact pads is in contact with a sidewall and bottom surface of a corresponding first spacer.

* * * * *